United States Patent
Summerson et al.

(10) Patent No.: US 9,444,494 B2
(45) Date of Patent: Sep. 13, 2016

(54) SYSTEMS AND METHODS FOR NETWORK CODING USING CONVOLUTIONAL CODES

(71) Applicant: Texas Instruments Incorporated, Dallas, TX (US)

(72) Inventors: Samantha Rose Summerson, San Leandro, CA (US); Anuj Batra, Dallas, TX (US); June Chul Roh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/552,710

(22) Filed: Nov. 25, 2014

(65) Prior Publication Data
US 2016/0013812 A1     Jan. 14, 2016

Related U.S. Application Data

(63) Continuation of application No. 13/596,000, filed on Aug. 27, 2012, now Pat. No. 8,924,831.

(60) Provisional application No. 61/527,954, filed on Aug. 26, 2011.

(51) Int. Cl.
| | |
|---|---|
| *H03M 13/03* | (2006.01) |
| *H03M 13/23* | (2006.01) |
| *H03M 13/27* | (2006.01) |
| *H03M 13/37* | (2006.01) |
| *H03M 13/41* | (2006.01) |

(52) U.S. Cl.
CPC ........... *H03M 13/235* (2013.01); *H03M 13/23* (2013.01); *H03M 13/2707* (2013.01); *H03M 13/373* (2013.01); *H03M 13/41* (2013.01)

(58) Field of Classification Search
CPC .. H03M 13/23; H03M 13/31; H03M 13/373; H03M 13/235
See application file for complete search history.

(56) References Cited

U.S. PATENT DOCUMENTS

| | | | |
|---|---|---|---|
| 8,095,859 B1 * | 1/2012 | Peterson | H03M 13/116 714/801 |
| 8,185,811 B2 * | 5/2012 | Li | H03M 13/373 714/795 |
| 2002/0006138 A1 * | 1/2002 | Odenwalder | H04L 1/0006 370/468 |
| 2002/0172292 A1 * | 11/2002 | Gray | H03M 13/2742 375/259 |
| 2004/0025102 A1 * | 2/2004 | Yokokawa | H03M 13/258 714/755 |
| 2004/0128696 A1 * | 7/2004 | Bhaskaran | H03M 13/29 725/111 |
| 2006/0236211 A1 * | 10/2006 | Shieh | H03M 13/09 714/781 |
| 2009/0300469 A1 * | 12/2009 | Rajakarunanayake | H04L 1/0041 714/776 |
| 2010/0201398 A1 * | 8/2010 | Zhao | H04L 1/0041 326/52 |
| 2010/0205510 A1 * | 8/2010 | von der Embse | G06F 17/148 714/776 |
| 2012/0151295 A1 * | 6/2012 | Neeman | H03M 13/6544 714/755 |
| 2013/0297994 A1 * | 11/2013 | Eroz | H03M 13/2957 714/790 |

* cited by examiner

*Primary Examiner* — Guerrier Merant
(74) *Attorney, Agent, or Firm* — Ronald O. Neerings; Frank D. Cimino

(57) ABSTRACT

A network coding method includes receiving a plurality of input packets each having a packet length. Encoding the plurality of input packets by applying a convolutional code across symbols in corresponding positions of the plurality of input packets obtaining a number of encoded packets. The number of encoded packets obtained being more than the number of input packets.

7 Claims, 6 Drawing Sheets

$m_{K,i}, ..., m_{2,i}, m_{1,i}$ $m_{K,i+3}, ..., m_{1,i+3}, ..., m_{K,i+2}, ..., m_{1,i+2}, ..., m_{K,i+1}, ..., m_{1,i+1}, ..., m_{K,i}, ..., m_{1,i}$ $$410 \longrightarrow \begin{pmatrix} a_{1,1} & a_{1,2} & a_{1,3} & a_{1,4} & a_{1,5} \\ a_{2,1} & a_{2,2} & a_{2,3} & a_{2,4} & a_{2,5} \\ a_{3,1} & a_{3,2} & a_{3,3} & a_{3,4} & a_{3,5} \\ a_{4,1} & a_{4,2} & a_{4,3} & a_{4,4} & a_{4,5} \end{pmatrix} \quad 400$$

$$412 \longrightarrow \begin{pmatrix} a_{1,1} & a_{1,2} & a_{1,3} & a_{1,4} & a_{1,5} & a_{2,1} & a_{2,2} & a_{2,3} & a_{2,4} & a_{2,5} \\ a_{3,1} & a_{3,2} & a_{3,3} & a_{3,4} & a_{3,5} & a_{5,1} & a_{5,2} & a_{5,3} & a_{5,4} & a_{5,5} \end{pmatrix}$$

$$414 \longrightarrow \begin{pmatrix} b_{1,1} & b_{1,2} & \cdots & b_{1,N} & b_{2,N+1} & b_{2,N+2} & \cdots & b_{2,2N} \\ b_{3,1} & b_{3,2} & \cdots & b_{3,N} & b_{4,N+1} & b_{4,N+2} & \cdots & b_{4,2N} \end{pmatrix}$$

$$416 \longrightarrow \begin{pmatrix} b_{1,1} & b_{1,2} & \cdots & b_{1,N} \\ b_{2,1} & b_{2,2} & \cdots & b_{2,N} \\ b_{3,1} & b_{3,2} & \vdots & b_{3,N} \\ b_{4,1} & b_{4,2} & \cdots & b_{4,N} \end{pmatrix}$$

FIG. 4b

SYSTEMS AND METHODS FOR NETWORK CODING USING CONVOLUTIONAL CODES

CROSS-REFERENCE TO RELATED APPLICATION

This application claims is a continuation of and claims priority to U.S. patent Ser. No. 13/596,000 filed on Aug. 27, 2012, which claims priority to U.S. Provisional Patent Application No. 61/527,954, filed on Aug. 26, 2011; which is hereby incorporated herein by reference. Additionally, the present application may be related to U.S. patent application Ser. Nos. 13/595,774, 13/595,862, 13/596,005, and 13/595,894.

BACKGROUND

In wireless networks, the ability to correctly receive data packets with increased reliability is important. Typically, if a packet is lost in transmission, the intended recipient requests that the sender retransmit the packet. However, certain systems that utilize a wireless network may require a very low packet loss and retransmission rate, for example where the data being transmitted via the wireless network is critical to the safety or performance of the system. In these systems, packet loss leading to requests for retransmission is unacceptable.

Network coding is a technique that can be used to improve the capacity and efficiency of network transmissions. Network coding functions by transmitting an encoded function of the data bits rather than the original data bits; subsequently, the function of the data bits is decoded to obtain the original data bits. Transmitting functions of the data bits in this manner can reduce the average number of transmissions needed for a given amount of information, which reduces the number of retransmissions needed if there are bit errors or erasures.

Other network codes are designed such that a large number of random linear combinations of packets are created from a number of original packets. These network codes are designed so that if the number of network coded packets received by the receiver and encoder is at least equal to the number of packets encoded, then there is high probability that the original packets are recoverable. However, these types of network coding provide insufficient error correction abilities, and performance is only guaranteed in cases where a sufficient number of packets are received correctly.

SUMMARY

The problems noted above are solved in large part by embodiments directed to a network coding method that includes receiving a plurality of message packets each having the same packet length. Encoding the plurality of message packets by applying a convolutional code across symbols in corresponding positions of the plurality of message packets resulting in a number of encoded packets. The number of encoded packets resulting after encoding the message packets being more than the number of message packets.

Other embodiments are directed to a wireless communication device that includes a packet receiver configured to receive a plurality of message packets. A convolutional encoder to apply a convolutional code across symbols in corresponding positions of the plurality of message packets to resulting in a number of encoded packets.

Yet another embodiment is directed toward a network decoding method for decoding a plurality of encoded packets encoded with a convolutional network encoder, the method includes receiving a plurality of packets from an error checker. Applying a Viterbi decoder to symbols in corresponding positions of the plurality of packets resulting in a number of decoded packets, where the decoded packets correspond to a number of originally encoded message packets.

BRIEF DESCRIPTION OF THE DRAWINGS

Figure 1A:
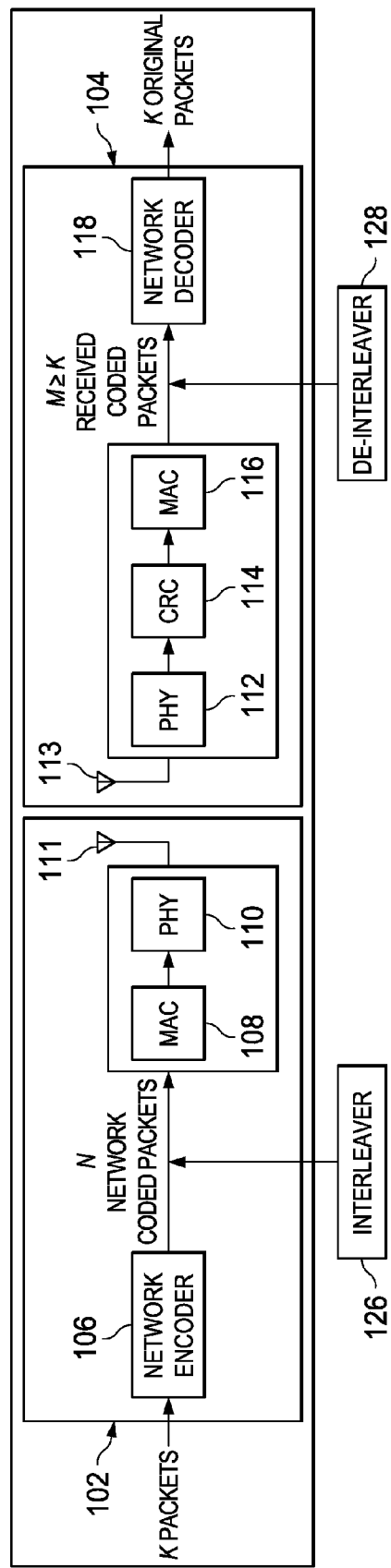
Figure 1B:
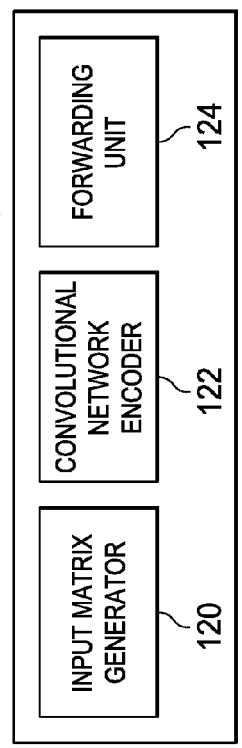
Figure 2:
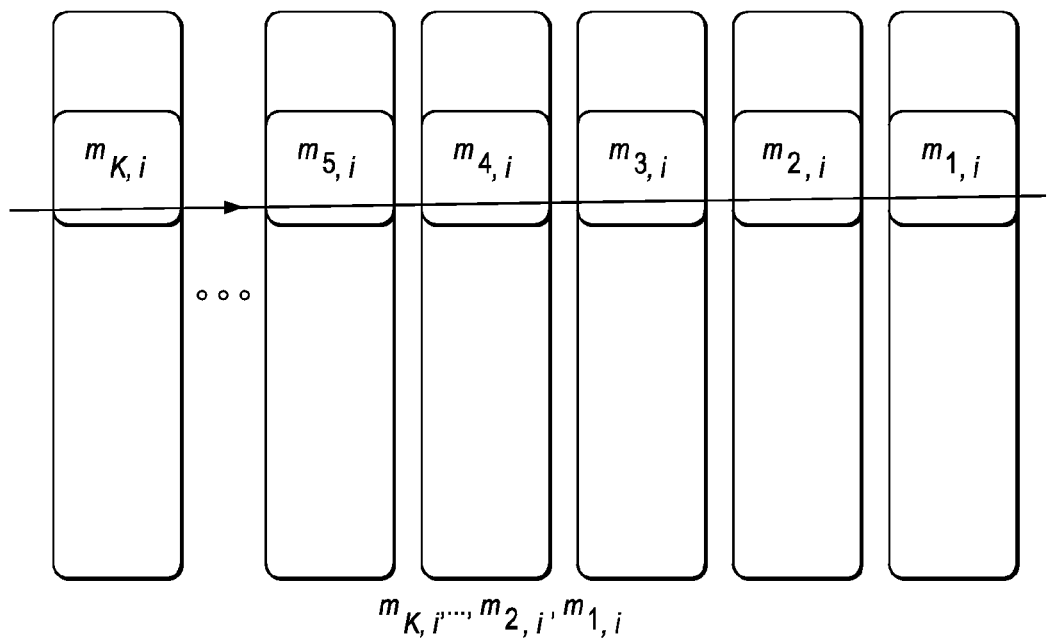
Figure 3:
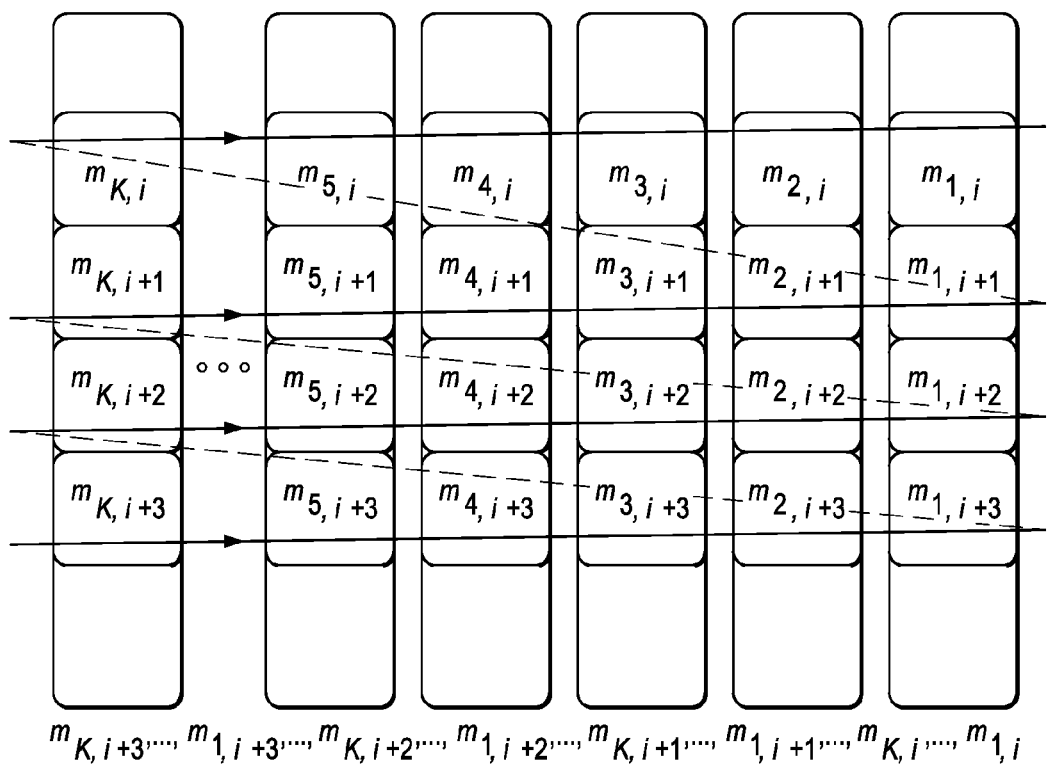
Figure 4A:
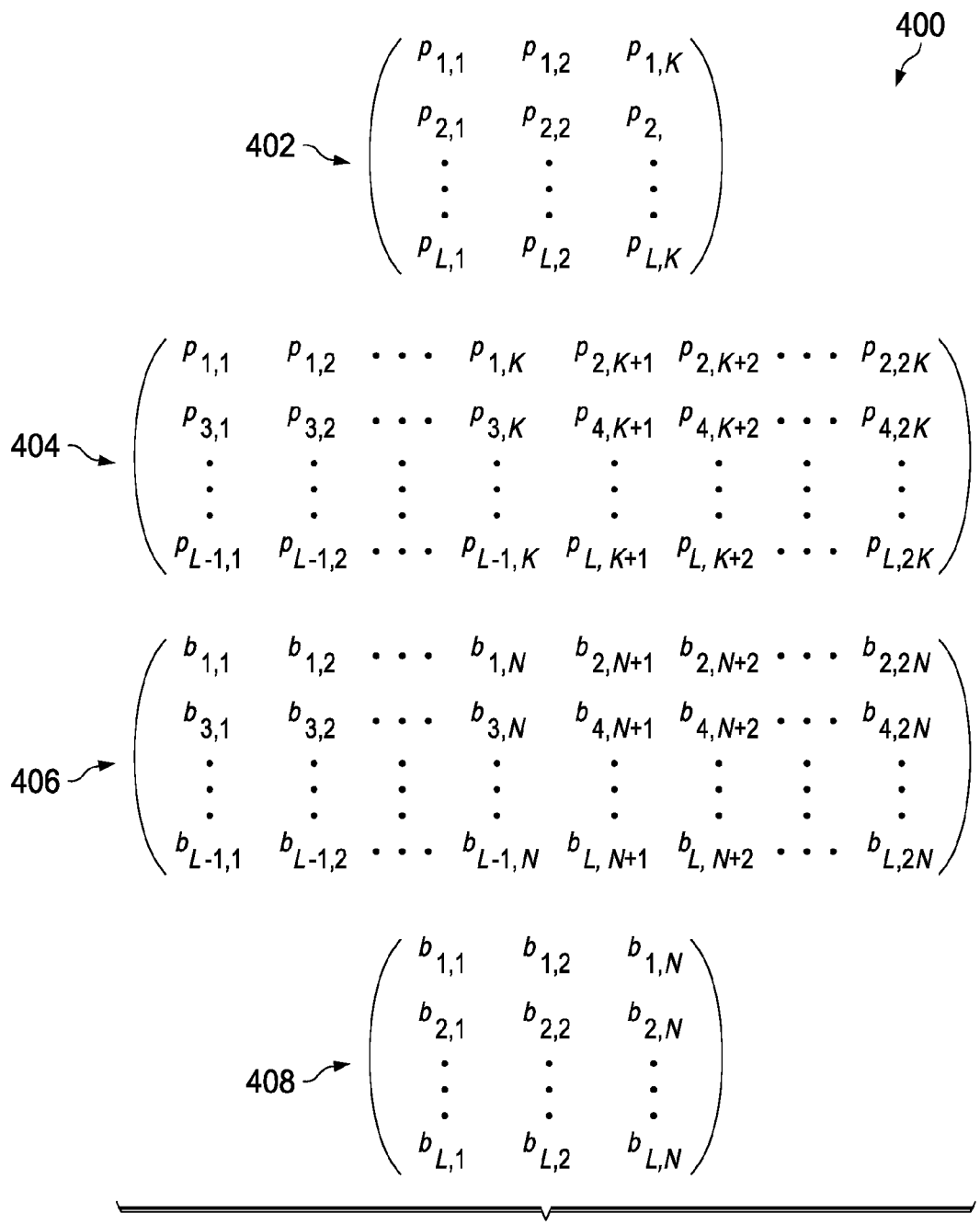
Figure 5:
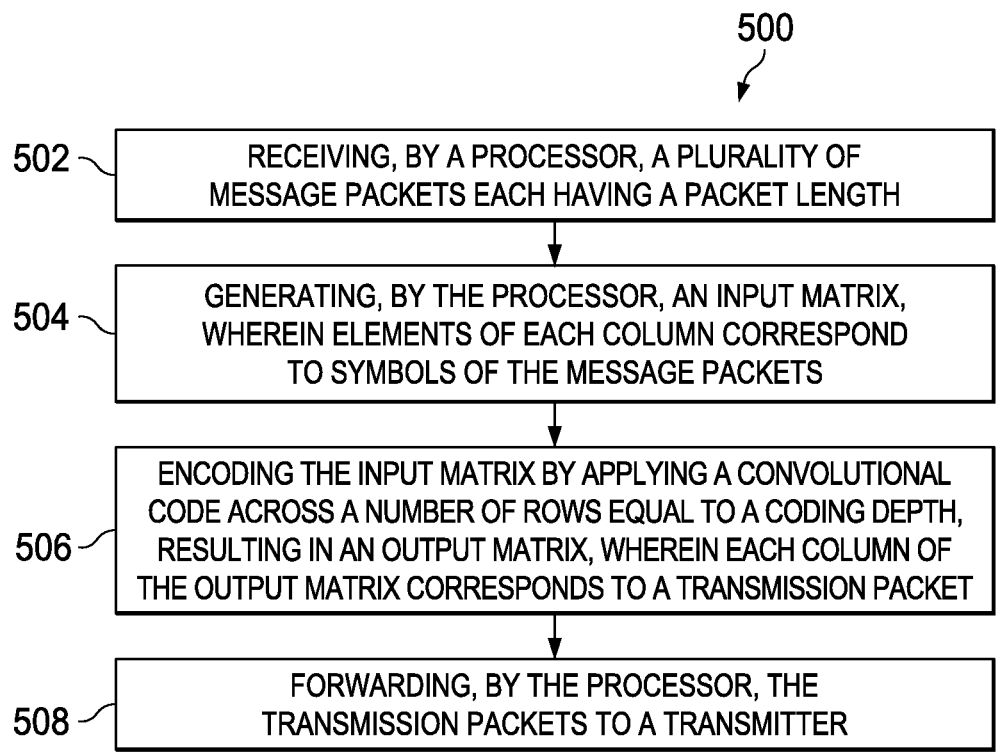
Figure 6:
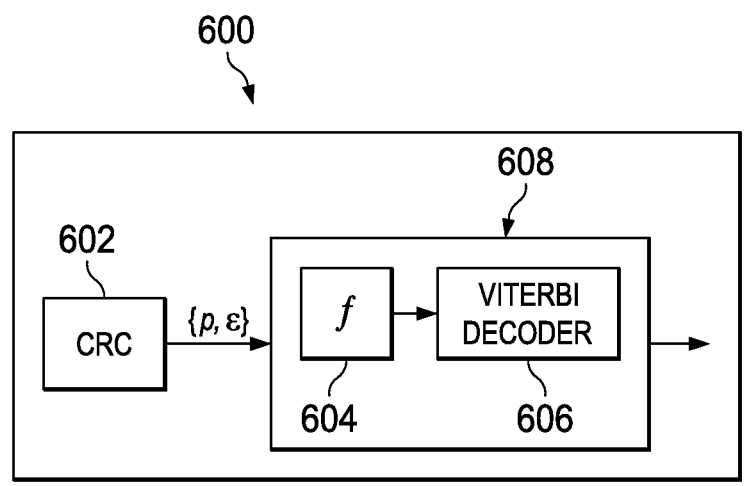
Figure 7:
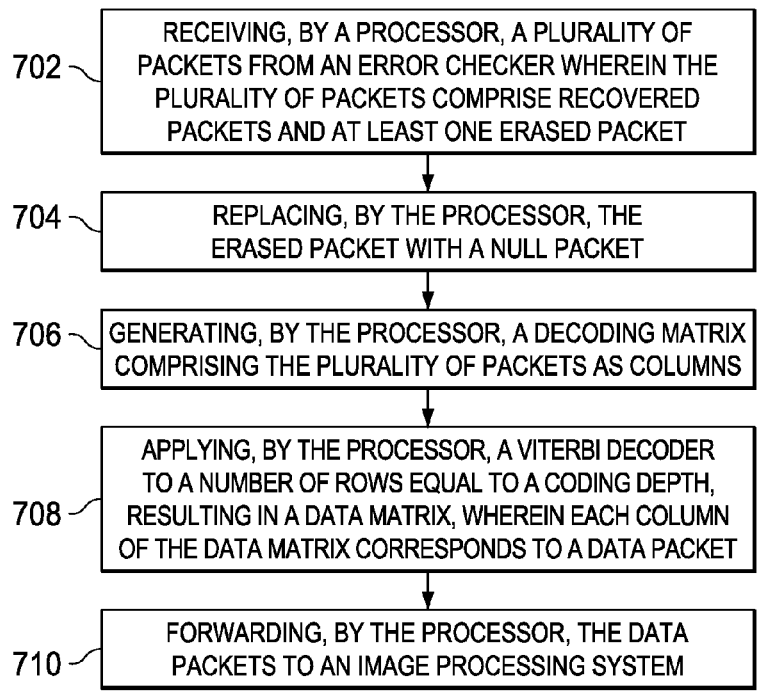
Figure 8:
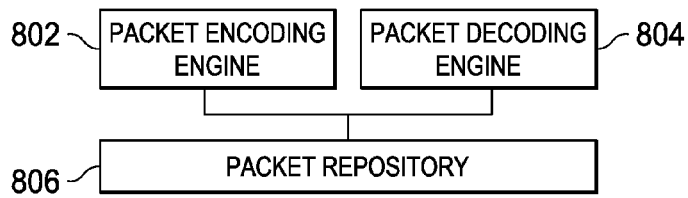
Figure 9:
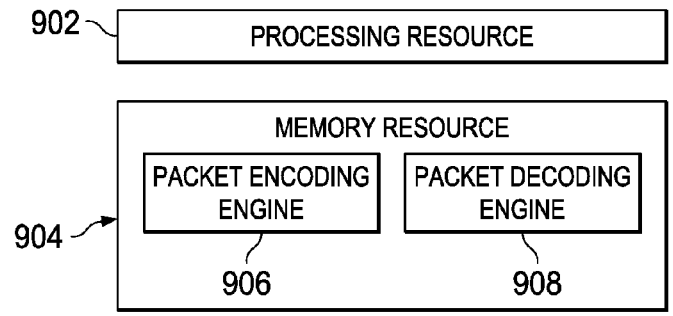

Having thus described the disclosure in general terms, reference will now be made to the accompanying drawings, which are not necessarily drawn to scale, and wherein:

FIG. 1a shows a block diagram of transmitter and receiver using (K, N) convolutional network code in accordance with various embodiments;

FIG. 1b shows a convolutional network encoder in accordance with various embodiments;

FIG. 2 shows the input to the convolutional network encoder having a coding depth of one in accordance with certain embodiments;

FIG. 3 shows the input to the convolutional network encoder having a coding depth of four in accordance with certain embodiments;

FIG. 4A shows the construction of a virtual matrix with a coding depth of D for encoding and the subsequent reformation of the matrix for obtaining the transmission packets in accordance with various embodiments;

FIG. 4B shows an example the virtual matrix encoding and reformation for a matrix of size 4×6 and a coding depth of 4 in accordance with various embodiments;

FIG. 5 shows a flow chart of a method for convolutional network coding in accordance with various embodiments;

FIG. 6 shows a block diagram of a decoder for convolutional network encoding in accordance with various embodiments;

FIG. 7 shows a flow chart of a method for decoding convolutional network coding in accordance with various embodiments;

FIG. 8 shows a convolutional network coding system in accordance with various embodiments; and FIG. 9 shows an alternate convolutional network coding system in accordance with various embodiments.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

As used herein, the term "code of rate K/N" refers to a convolutional code that produces N symbols from K symbols.

As used herein, the term "message packet" refers to packets that contain data to be transmitted from one node to another node in a wireless network.

As used herein, the term "encoded packet" or "encoded message packets" refers to message packets that have been encoded using convolutional network code.

As used herein, the terms "reliability" or "log-likelihood ratio" refer to a level of confidence designation the receiver-side PHY gives to each symbol of the transmission packets received and denotes the receive-side PHY's confidence in the correctness of that symbol.

As used herein, the term "recovered packet" refers to encoded packets successfully received by a decoder and each symbol in the recovered packets have an associated high reliability designation from the receiver-side PHY.

As used herein, the term "erasure packets" are placeholder packets for an encoded packet that has been deemed bad, and thus discarded, due to the PHY of the receiver having no confidence in at least one symbol of the packet. Additionally, losing a packet during transmission may also be considered an erasure packet, i.e., the CRC may map any lost packets to erasures.

As used herein, the term "soft information" or "soft data" refers to the information or packets that are the output of the receiver-side PHY. This soft information is the encoded packets augmented with the receiver side PHY's reliability or log-likelihood ratio designations.

As used herein, the term "hard information" or "hard data" refers to recovered bits.

As used herein, the term "coding depth" refers to the number of rows of a matrix or the number of blocks of bits or symbols of a number of message packets to be concatenated before being encoded or decoded. For example, when encoding using a coding depth of 4, the first 4 rows of a message packet matrix are concatenated prior to encoding. Similarly, the next 4 (and so on) rows of the packet matrix are concatenated prior to being encoded. In cases where the number of rows of the packet matrix is not evenly divisible by the coding depth then pad bits can be added to the bottom of each column to make the column evenly divisible by L.

As used herein, the term "scaling factor" is intended to mean a large number representing a strong probability of the bits in the recovered packets being correct since the packets passed the error checker, and 100 or 1000 is typically chosen.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In accordance with various embodiments, convolutional coding may be employed at the network layer to improve the error correction ability and the overall reliability of a wireless communication network. Convolutional network codes can be used in a variety of systems where reliability and spectral efficiency are of high importance. One example where reliability is of high importance is a wireless point-to-point imaging system used to convey images from reverse-looking cameras on vehicles to the dashboard display used by the vehicle operator. Another example is in military communications where the speed of transmitting an image is crucial to a unit's safety. Convolutional network codes may be advantageous in these types of applications due to their built-in redundancy and error correcting capabilities. Although the convolutional network code is described in the wireless network setting it can be implemented in many types of networks where reliability and spectral resources are critical.

In accordance with various embodiments, a convolutional code is applied across multiple message packets. Traditionally, a convolutional code is used to code over a single packet, or a block of bits to produce a larger block of bits that contains redundant information. In the traditional case, the amount of memory required to store the packets is small because the encoding is only performed across one packet of bits. However, the quality of convolutional encoding increase as packets become larger, although extra memory is required. To take advantage of time diversity in the system, we decide to implement the convolutional coding across a plurality of message packets to produce a larger number of encoded packets that are of the same size as the message packets. The resulting encoded packets can be then transmitted using an underlying wireless communication protocol. This flexibility permits the encoder to produce encoded packets of the same size as a plurality of message packets while preserving the memory requirements. Additionally, the use of more packets increases the redundancy and the error-correcting capacity of the transmission packets.

FIG. 1a shows a system 100 comprising a transmitter 102 and a receiver 104. The transmitter 102 further comprises a network encoder 106, a media access control (MAC) 108 and a physical layer (PHY) 110. The MAC 108 and the PHY 110 coordinate to enable wireless communications (e.g., transmitting and receiving data packets) via a wireless antenna 111. Similarly, the receiver 104 includes at least a PHY 112, a cyclic redundancy check (CRC) error-detecting block 114, a MAC 116 and a network decoder 118. As above, the MAC 116, the CRC 114 and the PHY 112 coordinate to enable wireless communications via a wireless antenna 113. In some embodiments, the CRC 114 may be replaced or supplemented by a different type of packet error-detecting block.

FIG. 1b shows a convolutional network encoder in accordance with various embodiments, the network encoder 106 applies a convolutional network code to a plurality of message packets, for example received from a higher-layer application executing on the transmitter 102. By performing the network convolutional coding at the network layer and above the physical layer, the coding may be implemented on top of underlying wireless protocols (e.g., Bluetooth or WiFi) without the need to modify hardware or software used for wireless communications using such protocols. The lack of required hardware changes is a result of applying the convolutional network coding to produce encoded packets in a form that the MAC 108 and PHY 110 are already designed to transmit and receive.

As an example, if the typical wireless system is configured to transmit K message packets of length L, then the convolutional network code may be applied to K message packets of length L and produce the N encoded packets of length L, where N is greater than K. In some embodiments the convolutional network encoder may reduce the amount of memory required for the encoding process by using an increased coding depth, maintaining the same number of N encoded packets for K message packets by yielding better performance for small values of K. Applying a convolutional code to a group of message packets to produce a larger number of encoded packets is beneficial compared to applying a convolutional code to a single packet.

In one embodiment, the convolutional network encoder 106 is configured to apply a convolutional code across bits or symbols in corresponding positions within the K message packets. A convolutional code is a type of error-correcting code where the inputs bit (or bits) is fed through a series of shift-registers or delay elements and the output bits are a linear combination of the input bit (or bits) and previous input bits. The convolution code may either be a recursive or systematic code, where the message bits appear directly in the output bits, or a non-recursive code. A convolutional code is typically specified by the following set of parameters: generator polynomials for the mother code (one for each output bit), constraint length (v+1) and rate, where v is defined as the memory in the shift register. The generator polynomials specifies the number of delay elements in the shift register and how the output bits are created from the input bit the delayed input bits. One value less than the constraint length determines the number of memory elements in the shift register, and also the degree of each generator polynomial. The rate is determined as the ratio of input bit (or bits) to the number of output bits at each clock cycle.

The rate of the code may be varied by puncturing (or removing bits) the output of the convolutional encoder. Thus, a rate 1/2 mother can become a rate 3/4 code. These punctured bits are removed from the bit stream and are not transmitted. At the receiver, the Viterbi decoder will re-insert zero values at the locations where the bit stream was punctured By applying the convolutional code across the message packets, the symbols of the N encoded packets are generated as linear combinations of the symbols from corresponding positions from the K message packets. This allows symbols from corresponding positions in the message packets to be encoded simultaneously and results in convolutional encoding across the packets as opposed to within the packets.

The encoding may be represented using matrices, where a matrix is formed out of the K message packets of length L, with the matrix being of size L×K. The convolutional code is then applied across each row of the matrix resulting in an encoded matrix of size L×N, wherein there are N columns and L rows. The columns have expanded to N from K due to the convolutional encoder's K/N coding rate. The N columns of the resulting matrix correspond to N transmission packets, which will be forwarded to MAC 108 and PHY 110 as shown in FIG. 1.

The convolutional network encoder 106 of FIG. 1*b* may encode over K message packets simultaneously instead of within a single message packet. Thus, when performing across multiple packets, the symbols in the encoded packets are linear combinations of the symbols from the current message packet and previous v message packets having the same position. Hence, a convolutional network code can be represented as parallel encoding of the block of symbols created from the bits in the corresponding positions in the block of message packets.

FIG. 2 shows the input to the convolutional network encoder 122 as one row of corresponding bit or symbol positions of K message packets. Thus, for K input packets, which are denoted as $m_i$ for i=1, . . . , K, of length L bits, a convolutional network code of rate KIN is modeled as parallel encoders operating over L input blocks of bits, $b_j$ for j 1, . . . , L, which are made up of the elements $m_{i,j}$ for i=1, . . . , K, meaning $b_j=(m_{1,j}, m_{2,j}, \ldots, m_{K,j})$.

As explained, the packets may be represented by column vectors of length L and the message packets form a matrix of size L×K. The network convolutional encoding is then equivalent to encoding each row of an encoding matrix with a convolutional code. The output blocks are of length N and a representative output matrix will have size L×N. Furthermore, the N columns of the representative output matrix define the corresponding N encoded packets. If the message packets are not of the same size, then smaller packets may be increased in length to match the size of the largest packet by adding pad bits. These pad bits may be inserted as zero bits at the end of the shorter message packets.

In certain cases, convolutional coding performance benefits from longer input strings because the longer the input string, the more built-in redundancy and thus better error correcting capabilities the convolutional code enables. In the above example, the length of the input is determined by the number of packets given by K. However, since K packets need to be stored when using a convolutional network code, the memory resource requirement may become prohibitively expensive. For example, rather than needing to store one packet of length L, K packets of length L are stored. Thus, the memory necessary to hold the packets before encoding is a size equal to L×K, not a length K. One solution to this problem is to apply the convolutional code to multiple concatenated blocks of symbols or bits (e.g., multiple rows of a representative matrix are encoded together). When this approach is used, the number of blocks encoded together is defined as the coding depth, D, of the convolutional network code.

Another effect of using a coding depth greater than one is that the encoding is not only performed across message packets, but is also performed within the message packets, or at least using contiguous blocks within the message packets. The coding within the message packets occurs for coding depths larger than one since each encoded packet is produced by encoding across multiple rows or blocks of the message packets. As explained above, each column of a coding matrix is a message packet, so using multiple rows for encoding will encompass multiple symbols from each message packet. For example, if a coding depth of 2 is used, then two rows of a matrix, or 2 K corresponding symbols, will be encoded across to produce one encoded packet with two symbols from each message packets being encoded. Therefore, each encoded packet is the result of encoding across K message packets and within 2 symbols of each message packet By concatenating the rows of the input matrix or blocks of bits of the message packets, a relatively small number of large packets are transformed into a larger number of small packets and is equivalent to reshaping an input matrix to have size L/D×K*D. Hence, it is desirable to have large K*D, which has the positive effect of reducing the number of message packets needed to be stored in memory before encoding as the coding depth increases. This is because as D increases, fewer columns, or message packets, are required to produce the same N columns in the encoded matrix, and thus the same N encoded packets. Therefore, memory requirement is reduced because KID fewer message packets are needed to produce the same N output packets. Another way of representing the concatenated blocks is to visualize applying the convolutional encoding on virtual matrices of size K/L×K*D.

FIG. 3 shows the application of a convolutional network code using a coding depth of 4. The figure depicts the convolutional network code encoding across corresponding positions of K message packets starting at symbol $m_{1,i}$ and proceeding to symbol $m_{K,i}$ then starting over at the next position in the K message packets (i.e., symbols $m_{1,i+1}$ through $m_{K,i+1}$). Similarly, the convolutional network code then encodes across a third and fourth position of the K message packets. Additionally, the arrows in FIG. 3 depict a possible order the symbols may be fed into the convolutional network encoder 122 due to the sequential application of convolutional codes. Other embodiments may apply the convolutional network code to K message packets in another packet order.

Alternatively, encoding across the multiple rows as shown in FIG. 3 can be seen as encoding across a virtual matrix with the first row of the virtual matrix comprising symbols $m_{1,i}$ through $m_{K,i+3}$, or one row of the virtual matrix comprises four rows of the input matrix. Subsequent to performing the convolutional code across the virtual matrix, the virtual rows are "reassembled" into their original position to form the encoded matrix, again resulting in N transmission packets of length L corresponding to the columns of the encoded matrix.

FIG. 4a shows the use of the virtual matrix and a coding depth of 2 for encoding K message packets. Picturing the use of the coding depth as forming virtual matrices encoding is depicted in matrices 400. Input matrix 402, which is of size L×K, has symbols $p_{i,j}$ where i=1, 2, ... L and j=1, 2, ... K. Virtual input matrix 404 shows the reformed input matrix 402 having a first row of length 2 K, where the bits start at $p_{1,1}$ and end at $p_{1,2K}$. This is done by moving the second row of the input matrix to the end of the first row. This is done for every other row until row L has been moved. As a result, the number of rows of the virtual input matrix is reduced by a factor of the coding depth to L/2. After performing convolutional coding across each row of the virtual input matrix, a virtual encoded matrix 406 is obtained. The virtual encoded matrix has 2N columns since the input to the encoded was 2 K columns and has L/2 rows. The number of rows does not increase since the convolutional code is only applied across the rows and not down the columns. Lastly, encoded matrix 408 is reformed by moving half of each virtual row back to its original position.

FIG. 4b depicts another example of the virtual matrix representation of the input and encoding matrices using a coding depth of 2 and 5 message packets of length 4. The input matrix 410 is size 4×5. The virtual input matrix 412 becomes 2×10 since D equals 2 and the virtual matrix is L/D×K*D. The virtual encoded matrix 414 results from performing the convolutional encoding across the rows of the virtual input matrix. Virtual encoded matrix 414 has 2 rows and 2N columns. As above, reforming the virtual encoded matrix 414 results in an encoded matrix 416 having 4 rows (the length of the message packets) and N columns, which correspond to N encoded packets.

FIG. 5 shows a method 500 of convolutional network coding in accordance with various embodiments. The method 500 begins in block 502 with receiving K message packets of length L. The method 500 continues in block 504 with transforming the K message packets into an input matrix X where the columns of the input matrix X correspond to the message packets. The method 500 continues in block 506 with encoding the input matrix by applying the convolutional code across a coding depth number of rows of the matrix X. Step 506 also obtains an output matrix as a result of the encoding, wherein each column of the output matrix corresponds to an encoded packet. Lastly, the method 500 ends in block 510 with forwarding the encoded packets to the transmitter.

In some embodiments, the method 500 may utilize a convolutional coding depth of one or greater than one. If a coding depth greater than one is utilized, then the convolutional code is applied across more than one row of the input matrix X to produce each encoded packet. The number of rows encoded across to produce one encoded packet will be equal to the coding depth chosen. For example, if a coding depth of 4 is chosen (as shown in FIG. 3), then the first four rows will be encoded across in order to produce one row of an encoded matrix. This is done by first encoding over the K symbols of row 1 followed by the K symbols of rows 2, 3 and 4. An alternate way to envision the application of a convolutional code using a coding depth of 4 is concatenating the first four rows of the input matrix and applying the convolutional code across the concatenated row to produce one row of an encoded matrix. The convolutional code is then applied to any subsequent rows of the input matrix.

In certain embodiments where the convolutional code is applied to a number of rows specified by the coding depth, this process is repeated for subsequent numbers of rows specified by the coding depth until row L (e.g., the last row in the input matrix) is encoded. If a coding depth is chosen such that the L/D ratio is not an integer, then padding bits may be added to the bottom of each column (i.e., to increase the effective value of L) such that the effective L/D ratio is an integer. In this case, a modified set of K input packets (i.e., including the padding bits at the bottom of each packet) can be received by the encoder to continue the encoding process. In other embodiments, padding bits may be added in other locations such as at the top of each column, interspersed throughout each column, or the like to ensure that the L/D ratio is an integer.

In some embodiments, tail bits must be inserted at the end of a row (i.e., where the coding depth is 1) or at the end of multiple rows (i.e., where the coding depth is greater than 1) to flush out the memory elements of the encoders. In some embodiments a tail-biting convolutional encoder is used and thus such tail bits are not necessary.

Referring back to FIG. 1, decoding convolutional network codes can be implemented at or above the MAC layer 116 of the receiver 104 so that no changes are required to the PHY 112, which may be designed to implement a standard wireless communication protocol (e.g., Bluetooth, WiFi). In some embodiments, the convolutional decoding is implemented at the network layer. Additionally, the network decoder 104 can be configured to utilize either soft information or hard information to decode the encoded packets. The encoded packets have been encoded using a convolutional network code characterized by the further use of a coding depth. The coding depth used can either be one or greater than one. However, the coding depth chosen at the encoder must also be used at the decoder to ensure the transmission packets are properly decoded. Lastly, the decoder may already know the coding depth used by the encoder or the coding depth may be transmitted to the decoder within the N encoded packets.

The PHY 112 receives encoded packets, for example that are sent by the transmitter 102. In addition, receiver-side PHY 112 evaluates the received encoded packets and assigns confidence values to each symbol in those packets. Soft information or soft data refers to the confidence characterization along with the received symbols or bits. The confidence determinations are designated with reliability or log-likelihood ratio values and indicate the level of confidence of the PHY 112 has in that symbol or bit being correctly received. The PHY 112 then releases a bit stream for each encoded packet.

The CRC 114 receives the bit stream from the PHY 112 and uses that bit stream to determine whether there have been any bit errors in the recovered bit stream for a packet. If the CRC 114 detects bit errors in a recovered bit stream for a packet, then that entire packet may be discarded and a placeholder, or erasure packet, is put in its place. If the CRC does not detect any bit errors in a recovered bit stream for a packet, referred to as passing the CRC 114, then the hard information (recovered packets of bits) or soft information (log-likelihood ratios or reliability information) is passed up to the higher layers of the receiver 104. Additionally, encoded packets may also be lost during transmission. In this situation, the lost packet will be replaced by an erasure packet. The network decoder 118 may be configured to receive hard information, soft information, or both.

FIG. 6 depicts a block diagram of a receiver 600 where hard information is available to a network decoder 608. The output of CRC 602 of receiver 600 may include recovered packets and erasure packets. Here, the recovered packets represent a subset of the N encoded packets. Although depicted as a CRC 602, the error checker may be another type of error checker in certain embodiments. The hard information and erasure packets coming from the CRC 602 is received by the mapping function f 604.

The mapping function 604 feeds a Viterbi decoder 606. The Viterbi decoder is a maximum likelihood algorithm that is used to decode convolution codes. The Viterbi decoder determines the optimum transmitted sequence by searching through the mostly likely paths, where the path values are determined by summing the LLRs for the symbols on that path. The traceback length is a key parameter of the Viterbi decoder and determines how far we traceback through the likely path before a bit can be determined. The longer the traceback length the better the performance, but it comes at the expense of higher memory. The nearly-optimal value of the traceback length is well known in the literature. The input to a Viterbi decoder can either be hard information or soft information. The soft inputs result in a 3 dB improvement over hard inputs. Thus, the mapping function f is used to take the hard inputs and map them to pseudo "soft information". The reason is to get better performance. In the case when we have soft information, then we don't need the mapping function.

In some cases, the Viterbi decoder 606 encounters difficulty when required to accept erasures as inputs, and thus the mapping function f 604 is employed that maps the recovered packets and the erasure packets to mapped packets where the elements of each of the mapped packets have values that model reliability or log-likelihood ratio information associated with each symbol. Additionally, the Viterbi decoder 606 is configured to accept N packets, so the erasure packets must be replaced so that the combination of the recovered packets and the replaced erasure packets equals N mapped packets.

For example, the mapping function f 604 receives a vector of length L from CRC 602 that is either a recovered packet of symbols, p, or a packet erasure, $\epsilon$. The output of the mapping function f 604 is as follows:

$$f(x) = \begin{cases} 0 & x = \varepsilon \\ Q(2x-1) & x = p \end{cases}.$$

Where x represents the symbols in the packets and the scaling factor, Q, is selected to be a large number representing a strong probability of the symbols in the recovered packet, p, being correct since the packet passed the CRC 602. Typical values of Q may be on the order of 100 or 1000. The mapping function f 604 scales the symbols of the recovered packets so that they have high associated reliability values and replaces the erasures with a vector of L zeros representing no confidence in the packet's symbols. The vector of L zeros is referred to as a null packet. Using this function, the input to the Viterbi decoder 606 is N packets, a subset of which may include packets of all zeros.

The Viterbi decoder 606 then decodes across the recovered and erasure packets using bits or symbols in corresponding positions of the N packets. After decoding all N packets, the Viterbi decoder obtains the originally encoded message packets. In other embodiments, if the encoded packets were produced using a coding depth greater than one, then the Viterbi decoder will need to decode across a coding depth number of the combination of the recovered and erasure packets to obtain the original message packets.

Using matrices to represent the decoding of the encoded packets, the Viterbi decoder 606 first forms an encoded matrix out of the recovered and erasure packets. The received encoded matrix will be of size L×N, where the N columns correspond to the N packets (again, the combination of the recovered and erasure packets). The encoded matrix may also include columns of no-confidence symbols corresponding to each erasure packet. Since the packet error rate for a traditional wireless network system is low, it may be assumed that, for example, only one packet per block of N transmission packets fails the CRC 602. This results in periodic no-confidence bits appearing at the Viterbi decoder 606.

For example, referring back to FIG. 4b, if packet $p_2$ of matrix 416 fails the CRC 602, then input to the Viterbi decoder 606 includes no-confidence bits in the second position of all four rows. In this case, the period between erasure bits is N. This period is arrived at since the decoding is done sequentially and there are N symbols decoded between $b_{1,2}$ and $b_{2,2}$. However, if multiple packets fail the CRC 602, then a cluster of errors may be encountered by the Viterbi decoder 606, which may require a retransmission. In this case, if $p_2$ and $p_3$ of matrix 416 in FIG. 4b fail the CRC 602, then symbols $b_{1,2}$ and $b_{1,3}$ would be seen as an error cluster by the Viterbi decoder 606 due to sequentially decoding the rows.

An error cluster may result from multiple sequential transmission packets failing the CRC 602 resulting in erasure packets located next to each other in the decoding matrix. In such a scenario, retransmission may be required because Viterbi decoders may not have sufficient capability to decode clusters of errors. To ensure that the Viterbi decoder can correctly determine these bits, the convolutional network code should have an associated minimum distance, $d_{free}$, such that $d_{free}$ is less than N, meaning that there are N bits or symbols between each no-confident bit or symbol the decoder encounters. Additionally, the Viterbi decoder 606 should also use the same coding depth that was used for encoding and the coding depth used can either be known ahead of time by decoder 118 or can be communicated to the decoder 118 within the packet itself for all N transmission packets.

FIG. 7 shows a method 700 of convolutional decoding, for example performed by the network decoder 118 in accordance with various embodiments. The method 700 begins in block 702 with receiving the plurality of packets from the error checker wherein the plurality of packets comprises recovered packets and at least one erased packet. The method 700 continues with step 704 where the erasure packets are replaced with null packets and the bits in the recovered packets are scaled by a factor, Q. The method 700 continues at step 706 where an encoded matrix may be formed out of the recovered packets and the null packets. The resulting matrix is size L×N, where L represents the length of the packets and N is the number of packets. The method 700 continues at step 708 where the Viterbi decoder is applied to a coding depth number of rows of the decoding matrix. Here, the decoding depth used must be the same as the decoding depth used for encoding the message packets.

As a result of step 708, a decoded matrix of size L×K is obtained, where K is the number of columns and L is the length of the columns. More importantly, the columns of the decoded matrix correspond to the message packets that were originally encoded. The method 700 continues at step 710 by forwarding the message packets to an image processing system.

As explained above, decoding operations may be performed in the case where only hard information is available to the network decoder 118. Additionally, in some cases, soft information (encoded packets augmented with the PHY 112's determination of the reliability of each symbol within each packet) is also made available to the network decoder 118. In such cases, soft information is passed up from the MAC layer 116 to the Viterbi decoder 118. The CRC information (e.g., whether a bit error has occurred) is bypassed entirely and only the soft information is used. Since there are potentially no packet erasures, there are no periodic erasure bits at the Viterbi decoder as in the case where only hard information is used for decoding. Thus, the coding depth does not affect that performance of the convolutional network code when only soft information is used in decoding, and so the coding depth used at the encoder doesn't affect the decoder.

Another embodiment of method 700 that uses only soft information may also have periodic no-confidence bits due to packets being lost during transmission. In this scenario, the network encoder may add a sequence index to each of the N encoded packets transmitted. Then, if a packet is lost at the receiver, a sequence number will be missing. If a sequence number is not received, a packet is replaced with an erasure packet by the CRC 114. Again, the Viterbi decoder would need to apply any coding depth that was applied by the encoder to decode the message packets.

FIG. 8 shows a network coding system 800 in accordance with various embodiments. The network coding system 800 includes a packet encoding engine 802 and a packet decoding engine 804. In addition, a packet repository 806 may be coupled to the engines 802, 804. The packet encoding engine 802 and the packet decoding engine 804 are combinations of programming and hardware to execute the programming. Although shown separately, the packet encoding engine 802 and the packet decoding engine 804 are not required to represent separate pieces of software programming. For example, each engine 802, 804 may share a common processor and memory, although this is not required. Additionally, the programming that enables the functionality of each engine 802, 804 may be included in the same executable file or library.

The packet encoding engine 802 receives message packets that contain data to be transmitted from, for example, a higher-layer application executing on the transmitter 102. The message packets may be received from the packet repository 806. The packet encoding engine 802 also encodes the message packets to produce a number of encoded packets greater than the number of message packets. In accordance with various embodiments, the packet encoding engine 802 encodes the message packets by applying a convolutional code across a coding depth number of rows of an input matrix, wherein the input matrix comprises the message packets as columns. The packet encoding engine 802 performs the encoding process as is described above with respect to FIGS. 1, 2 and 3.

The packet decoding engine 804 receives a number of recovered packets. The packet decoding engine 804 may also receive an erasure packet or erasure signal (e.g., from a CRC 114) that indicates one or more transmission packets were not received successfully. The recovered packets and/or the erasure packets may be at least temporarily stored at the packet repository 806. The packet decoding engine 804 first replaces the erasure packet with a null packet before it forms a decoding matrix. The columns of the decoding matrix comprise the recovered packet and replaced packet, null packet. The packet decoding engine 804 applies a Viterbi decoder to the decoding matrix to generate a decoded matrix where each column corresponds to a message packet. This is similar to the decoding process as described above with respect to FIGS. 1, 6 and 7.

FIG. 9 shows another example of a network coding system 900 in accordance with various embodiments. The network coding system 900 includes a memory resource 904 coupled to a processing resource 902. The processing resource 902 is one or more local or distributed processors. The memory resource 904 includes one or more local or distributed memory devices and comprises a packet encoding module 906 and a packet decoding module 908. Thus, the memory resource 904 and the processing resource 902 are hardware components of the system 900.

Each module 906, 908 represents instructions that, when executed by the processing resource 902, implement an associated engine. For example, when the packet encoding module 906 is executed by the processing resource 902, the above-described packet encoding engine 802 functionality is implemented. Similarly, when the packet decoding module 908 is executed by the processing resource 902, the above-described packet decoding engine 304 functionality is implemented. The modules 906, 908 may also be implemented as an installation package or packages stored on the memory resource 904, which may be a CD/DVD or a server from which the installation package may be downloaded. Additionally, in some embodiments, the above-described functionality may be implemented in an application-specific integrated circuit (ASIC), a combination of an ASIC and software, or an application-specific instruction-set processor (ASIP).

Other embodiments may utilize additional structure to manage fading channels. For example, referring back to FIG. 1, an interleaver 126 may be placed after the network convolutional encoder 106 and a de-interleaver 128 may be placed before the network convolutional decoder 118 to add extra packet manipulation to assist with packet correction. Additionally, in other embodiments an inner code, presenting the channel code or code at the PHY 110 and PHY 112, may also be a linear block code, such as Bose-Chaudhuri-Hocquenghem (BCH) code or Reed-Solomon code. At the receiver 104, either a hard-output or soft-output PHY-layer decoder may be used to produce the hard or soft information, respectively, that is used by the network convolutional decoder 118. The coding depth and constraint length of the convolutional code can be adaptively chosen depending on the complexity requirements or channel conditions.

The above discussion is meant to be illustrative of the principles and various embodiments of the present disclosure. Numerous variations and modifications will become apparent to those skilled in the art once the above disclosure is fully appreciated. For example, other types of networks, whether connected wirelessly or by any other type of connection medium (e.g., copper wire, coaxial cable, optical cables) may employ embodiments of the present disclosure to ensure reliability and spectral efficiency. It is intended that the following claims be interpreted to embrace all such variations and modifications.

What is claimed is:

1. A network coding method, comprising:
   receiving, by a processor, a plurality of input packets each having a packet length including a current input packet; and
   encoding the plurality of input packets by applying a convolutional code across symbols in corresponding positions of the plurality of input packets to obtain a number of network encoded packets,
      wherein the number of network encoded packets is more than the number of input packets,
      wherein the network encoded packets are a linear combination of the current input packet and a plurality of previous input packets, and
      wherein the convolutional code is applied to a concatenated block of the plurality of input packets equal to a coding depth greater than one; and
   employing a mapping function to prepare the network encoded packets for a Viterbi decoder.

2. The method of claim 1 wherein the encoded packets are forwarded to a transmitter.

3. The method of claim 1 further comprising:
   adding, by the processor, pad bits to the end of all input packets shorter than a longest message packet to make all input packets equal in length.

4. A wireless communication device comprising:
   a packet receiver to receive a plurality of input packets including a current input packet;
   a convolutional encoder to apply a convolutional code across symbols in corresponding positions of the plurality of input packets to obtain a number of encoded packets,
      wherein the network encoded packets are a linear combination of the current input packet and a plurality of previous input packets, and wherein the convolutional code is applied to a concatenated block of the plurality of input packets equal to a coding depth greater than one;
   a physical layer to receive the number of encoded packets;
   a Viterbi decoder to decode across a decoding depth of symbols of the number of encoded packets to obtain a number of decoded packets, wherein the symbols used come from corresponding positions of the encoded packets; and
   a forwarding unit to forward the message packets to a higher layer of the system.

5. The wireless communication device of claim 4 wherein the number of encoded packets is larger than the number of input packets.

6. The wireless communication device of claim 4 wherein the packet receiver is further configured to add pad bits to the end of all input packets shorter than a longest input packet to make all input packets equal in length.

7. The wireless communication device of claim 4 further comprising:
   an interleaver unit configured to interleave encoded packets before they are sent to a transmitter.

* * * * *